United States Patent [19]

Copeland et al.

[11] 3,952,403

[45] Apr. 27, 1976

[54] SHELL EYELET AXIAL LEAD HEADER FOR PLANAR CONTACT SEMICONDUCTIVE DEVICE

[75] Inventors: Ben H. Copeland, Tempe; Richard L. Schaffert, Mesa, both of Ariz.

[73] Assignee: Motorola, Inc., Chicago, Ill.

[22] Filed: Oct. 24, 1974

[21] Appl. No.: 517,726

Related U.S. Application Data

[63] Continuation of Ser. No. 408,203, Oct. 19, 1973, abandoned.

[52] U.S. Cl.................................. 29/588; 29/590; 29/591; 357/70
[51] Int. Cl.² ........................................ B01J 17/00
[58] Field of Search .............. 357/70; 29/576 S, 588, 29/590, 591, 589

[56] References Cited
UNITED STATES PATENTS

| | | | |
|---|---|---|---|
| 3,262,022 | 7/1966 | Caracciolo | 29/576 S |
| 3,450,956 | 6/1969 | Bauer | 29/591 |
| 3,735,213 | 5/1973 | Kausky | 357/80 |
| 3,859,715 | 1/1975 | Duffek | 29/588 |

Primary Examiner—W. Tupman
Attorney, Agent, or Firm—Michael D. Bingham; Maurice J. Jones, Jr.; Harry M. Weiss

[57] ABSTRACT

A shell eyelet axial lead header for a planar contact semiconductive device is disclosed wherein a series of bonding pads are first formed as part of a lead frame. The bonding pads are in a planar configuration, are supported by small breakable tabs from a surrounding ring and when the ring is broken away, the tabs are isolated from each other.

A shell eyelet, a glass preform with lead holes therethrough, leads with braze material attached at one end and a lead frame with bonding pads attached are assembled in an appropriate manner and passed through a furnace. The glass melts and bonds to the leads, to the shell eyelet and to the bonding pads. The lead braze melts and bonds the leads to the bonding pads. After cooling the supporting ring of the bonding pads is broken away to leave the isolated bonding pads and the finished device.

If the bonding pads are not sufficiently planar so as to receive the beams of a beam lead device, the bonding pads may be lapped to flatness.

7 Claims, 6 Drawing Figures

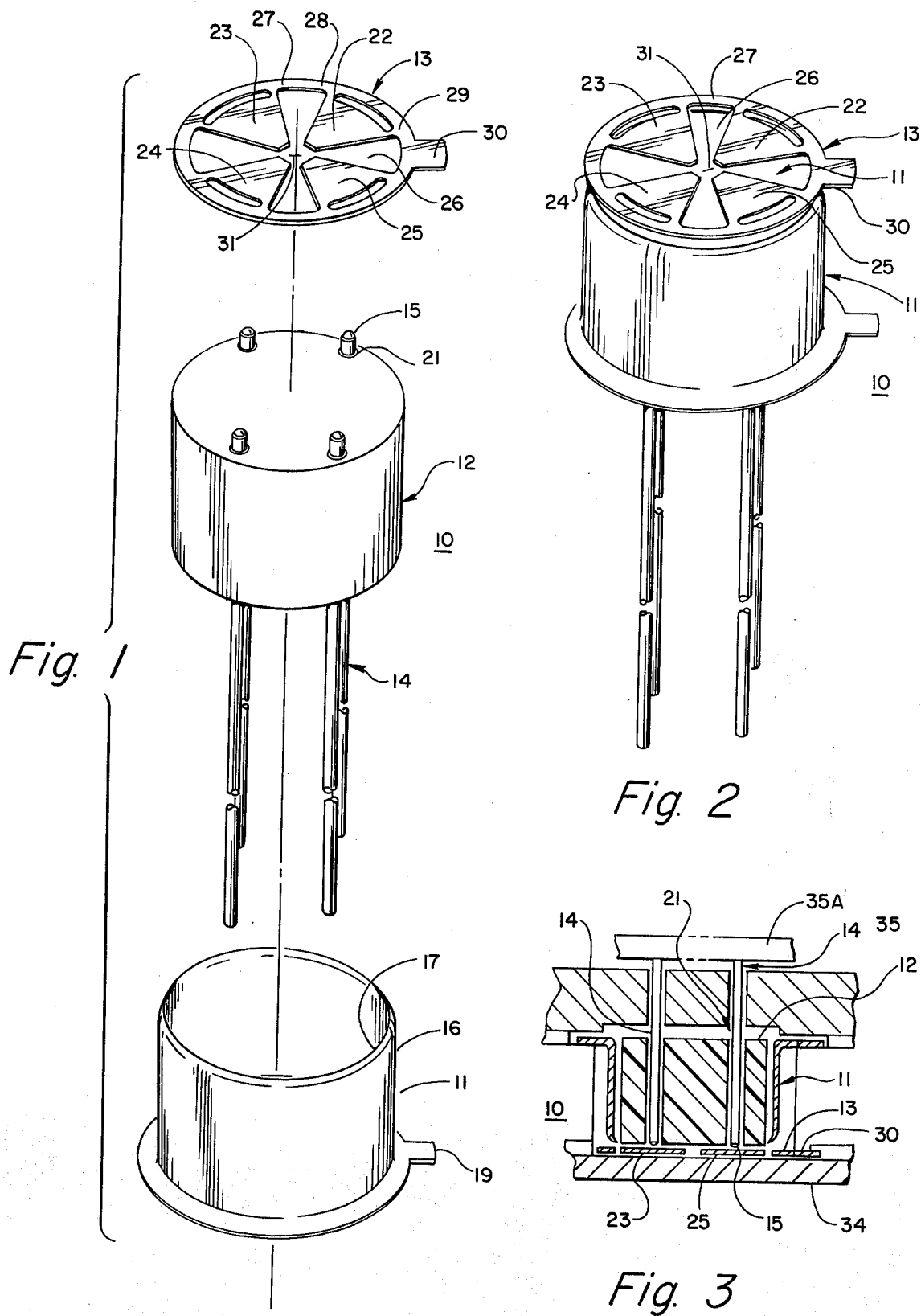

3,952,403

SHELL EYELET AXIAL LEAD HEADER FOR PLANAR CONTACT SEMICONDUCTIVE DEVICE

This is a continuation of application Ser. No. 408,203, filed Oct. 19, 1973, now abandoned.

BACKGROUND OF THE INVENTION

This invention relates to shell eyelet headers, more particularly to shell eyelet axial lead headers, for planar contact semiconductive devices such as beam lead semiconductive devices and it is an object of the invention to provide an improved device of this nature.

After a solid state device, such as a transistor, a diode or an integrated circuit, has been completed, there remains the problem of connecting from the appropriate points on the solid state device to the external world. Most frequently this is done by forming wire bonds from the connecting points on the solid state device to some form of lead frame or other packaging article. Wire bonding is expensive and time consuming and much time and effort have been devoted to eliminating it. Particularly, it is desirable to enable the semiconductive or solid state devices to be connected to axial lead type headers such, for example, as the TO-18 and TO-5 type headers because of the great economy involved in utilizing these headers without the use of wire bonds.

Beam lead devices have been developed wherein the contacts are made to leads in the form of beams extending from the semiconductive device in order to eliminate wire bonds. In beam lead devices, all of the beams extend from the semiconductive device in a single plane. Similarly, other planar type contact mechanisms have been developed such, for example, as those in which small copper balls are bonded to the appropriate contact points on the planar surface of a semiconductive device. Thereafter, the semiconductor device or chip with copper balls bonded to all of the necessary contact points is turned upside down or flipped into position on some form of a lead frame or package arrangement. Prior art axial lead header devices for the foregoing purposes have not been satisfactory because of the additional effort necessary to bond the semiconductive device to the leads forming part of the headers or secondary operations have been necessary in order to make the ultimate device usable.

According to the invention, the bonding pad surface of the header may be made perfectly flat or planar and thus it is possible to bond or otherwise attach all of the contact points of a beam lead, or other planar contact, semiconductive device to the bonding pads of the header at the same time. Individual treatment for each contact and bonding pad are therefore eliminated.

Accordingly, it is a further object of the invention to provide an improved shell eyelet axial lead header for planar contact semiconductive devices which will eliminate the disadvantages of the prior art.

It is a further object of the invention to provide a shell eyelet axial lead header for semiconductive devices wherein multiple isolated bonding pads may be formed as part of axial lead packages of high reliability and moderate costs.

SUMMARY OF THE INVENTION

In carrying out the invention according to one form, there is provided a shell eyelet axial lead header for planar contact semiconductive device comprising: a metallic shell eyelet; a glass preform interiorly of the shell eyelet and bonded thereto; a series of conductors extending through openings in the glass preform and bonded thereto; the upper ends of said conductors terminating essentially at the upper surface of the glass preform; a layer of bonding material atop each one of the conductors substantially in the plane of the upper surface; and a series of relatively rigid bonding pads, one each for each of the conductors, separated from each other and disposed on the upper surface and bonded thereto; one each of the bonding pads being bonded to one each of the conductors at its upper end by the respective layer of bonding material; the upper surfaces of the bonding pads lying in a flat plane for receiving the rigid leads of the semiconductive device.

In carrying out the invention according to a further form, there is provided a shell eyelet axial lead header for a planar contact semiconductive device comprising: a metallic shell eyelet; a glass preform interiorly of the shell eyelet and bonded thereto; a series of conductors extending through openings in the glass preform and bonded thereto; the upper ends of the conductors terminating essentially at the upper surface of the glass preform; a layer of bonding material atop each of said conductors substantially in the plane of the upper surface, and a relatively rigid planar framework of isolated bonding pads and a supporting exterior ring for said bonding pads disposed atop the upper surface with one each of the bonding pads being bonded to one each of the conductors at its upper end by the respective layer of bonding material, the bonding pads being bonded to the upper surface of said glass preform, the upper surfaces of the bonding pads lying in a flat plane.

BRIEF DESCRIPTION OF THE DRAWINGS

For a more complete understanding of the invention, reference should now be had to the accompanying drawings in which:

FIG. 1 is an exploded perspective view of an enlarged scale of the components comprising the invention;

FIG. 2 is a perspective view of the device shown in FIG. 1 at one stage of completion;

FIG. 3 is a sectional view of the components assembled into a form for a bonding operation to take place;

DESCRIPTION OF THE PREFERRED EMBODIMENTS

Figure 5:
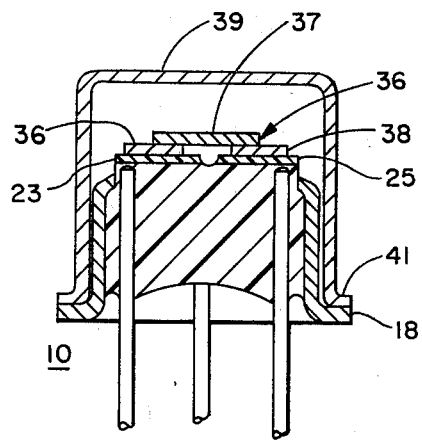
FIG. 5 is a sectional view similar to FIG. 3 showing the header according to the invention complete with a semiconductive device and a cap mounted thereover.

Referring to the drawings, there is shown a shell eyelet header with lead frame construction multiple bonding pads and axial leads 10 according to the invention. The individual components are designated at thus: shell eyelet 11, glass preform 12, lead frame multiple bonding pad assemble 13, a series of axial leads 14, and a series of particles or blobs of braze material 15.

The shell eyelet 11, made of any suitable material such, for example, as Kovar, may be a stamping having a cylindrical wall 16, a slightly curved edge 17 at one end and a right angularly extending flange or rim 18 at the other end. An orienting or attaching tab 19 may be formed as part of the rim 18.

The glass preform 12 is cylindrical in form and has dimensions such as to be just easily received within the interior of the eyelet 11 and may be formed of any suitable glass such, for example, as that known as 7052 glass in the industry, and has a series of axially extending holes 21 therein. Leads 14 which also may be formed of Kovar, for example, are received within the holes 21 and a small mass 15 or blob of braze or solder such, for example, as silver braze, is attached atop each one of the leads 14.

The multiple bonding pad lead frame assembly 13 comprises four bonding pads 22, 23, 24 and 25 separated from each other by spaces 26 and supported by an exterior ring 27, which is attached to each of the bonding pads by means of tabs 28 and 29. The outer edge of the ring 27 includes a tab 30 for locating or indexing purposes. The centers of the bonding segments 22, 23, 24 and 25 terminate short of each other, thereby leaving a space 31. Thus, it may be seen that except for the attaching tabs 27 and 28 for each of the bonding pads, the bonding pads are completely isolated from each other and when the ring, or rim, 27 is broken away as by manually breaking each of the tabs 28 and 29, the bonding pads 22, 23, 24 and 25 are completely isolated from each other.

Figure 6:
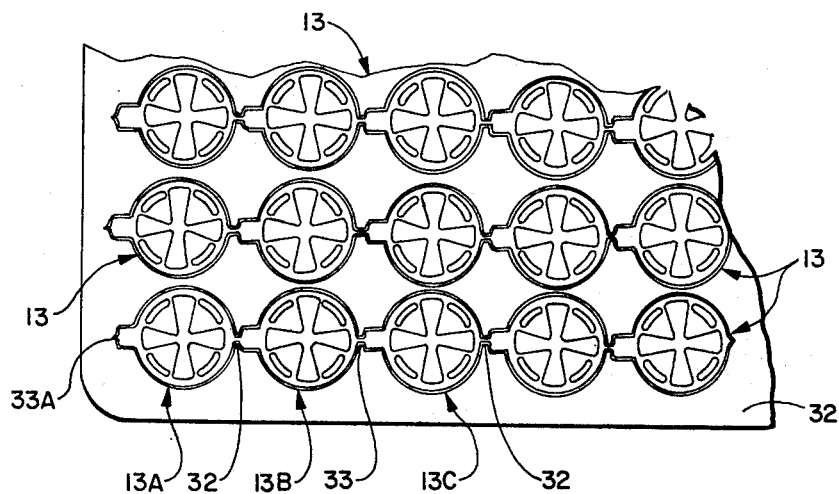
FIG. 6 is a plan view showing how suitably located isolated multiple bonding pads can be formed in a lead frame configuration.

Referring to FIG. 6, it will be seen that the multiple bonding pad lead frame assemblies 13 may be formed from a single sheet of material 32 in which a large number of bonding pad assemblies 13 are formed. The bonding pad assemblies 13 are completely severed from the sheet of material 13 and successive ones of the bonding pad assemblies in the same row, for example, 13A and 13B and 13C are attached to each other only by the very thin connecting pieces 33. The last one of the bonding pads in each row, for example, 13A is atached to the sheet stock 32 by a similar very thin connecting piece 33A. Thus by breaking the connecting piece 33A at each end of a row, a whole series of bonding pads 13A, 13B, 13C . . . may be removed from the sheet of stock material 32.

The material of the bonding pad assemblies may be Kovar similarly to the eyelet 11 and the leads 14. The thickness of the pads may be whatever is appropriate to the device being constructed, but relatively speaking, while the material may be very thin, for example three hundreths of an inch in thickness, it is nevertheless relatively rigid and capable of lying perfectly flat in a highly planar condition.

Referring to FIG. 3, there is shown one manner of constructing the shell eyelet header according to the invention. Thus the multiple bonding pad lead frame 13 is disposed in a holding recess on a flat supporting member or carrier 34, the shell eyelet 11 is disposed on the bonding pad 13, the glass preform 12 is disposed interiorly of the shell eyelet 11, the axial leads 14 are disposed in the openings 21 with the blobs of braze 15 disposed against the bonding pad members 22, 23, 24 and 25 (only 23 and 25 being shown in section). A second supporting member 35 having holes for leads 14 and a recess for the ring 35 is disposed as shown for supporting the leads 1 during the bonding process. If needed, a relatively light weight member 35A shown dot-dash, and made of graphite, for example, may be disposed upon the ends of the conductors or leads 14 is order to put a slight weight on these members. The described assembly may then be passed through an appropriate furnace having the necessary temperature at which the glass preform softens and melts to a certain extent. Thereupon the glass flows against the interior surfaces of the eyelet 11 and against the surfaces of the leads 14 thereby sealing these members to ech other as is well understood. At the same time, the blobs of braze material 15 melt and bond the ends of the leads 14 to the appropriate bondings pads 23 and 25 and 22 and 24. After the furnace operation is complete, the device is removed therefrom and allowed to cool also as is well understood whereupon the resulting structure is that shown in FIG. 2.

In the furnace operation, the surface of the glass preform 12 bearing against the bonding pads 23, 25, as well as 22 and 24, of course, bonds the glass of the preform to the bonding pads at the same time that the glass is bonded to the conductors and to the interior of the shell eyelet. In this manner, a completely rigid monolithic type structure is formed with the bonding pads firmly and completely flatly, planarly, held against the glass preform and thus to the completed shell eyelet header structure.

It will be clear that there need not be leads bonded to every bonding. Such constructions are within the scope of the invention.

After the sealed and bonded structure has been completely cooled, the tab 30 may be utilized to bend the ring 27 up and down so as to break the tabs 28 and 29 to free the ring 27. Thereafter the bonding pads 22, 23, 24 and 25 are completely isolated from each other while of course remaining in contact with the end of leads 14.

Figure 4:
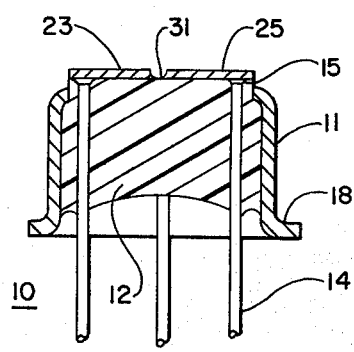
FIG. 4 is a sectional view on a somewhat smaller scale of the device according to the invention in completed form.

After the ring 27 has been removed, the completed structure is as shown in FIG. 4 by the sectional view. In this figure, the bonding pads 23 and 25 are shown but it will be understood that 22 and 24 are on the structure but at right angles to the view shown. If the bonding pads 22, 23, 24 and 25 are not sufficiently flat, or planar, the assembled structure as shown in FIG. 4 may have the bonding pads lapped so as to form a sufficiently planar surface to which a beam lead device 36, for example, may be bonded as shown in FIG. 5. In FIG. 5, the structure is the same as that shown in FIG. 5 except that the beam lead semiconductive device 36 is shown in position. Of the beam lead device 36, the semiconductive portion thereof is shown as 37 and the beam leads making contact thereto are identified by the reference character 38. The beam lead device is shown upside down in this figure and the beam leads 38 are then bonded by any suitable means to the bonding pads 23 and 25 shown. To complete the structure which may be of the TO-5 or TO-18 variety, a can or outer shell 39 is disposed over the assembly and a rim or flange 41 at the open end thereof is bonded as by welding, for example, to the flange or rim 18 of the shell eyelet.

Accordingly, a completely rigid shell eyelet header with lead frame construction multiple bonding pads has been provided with a minimum of effort and with a maximum of desirable attributes. Any solid state or semiconductive device in which the contacts thereto are in a plane may, of course, be bonded to the bonding pads of the inventive structure apart from the beam lead device specifically referred to. A device having high reliability and moderate costs in a well-known axial lead package has, according to the invention, been provided.

We claim:

1. A method for electrically contacting a multiple bonding pad led frame, said multiple bonding pads being attached to an exterior supporting ring, to terminal leads of an axial led header, comprising the steps of:
   disposing said multiple bonding pad lead frame within a flat supporting member;
   placing a supporting base onto said bonding pad lead frame, said supporting base having a shell eyelet, a glass preform disposed interiorly of said shell eyelet, and said terminal leads disposed within and extending therethrough to the bonding surface of said glass preform;
   bonding said multiple bonding pads to said terminal leads, said glass preform being softened during said bonding step for sealing said terminal leads interiorly of and to said shell eyelet with said glass preform being simultaneously bonded at the surface thereof to said multiple bonding pads; and
   removing said circular supporting ring for electrically isolating said bonding pads from each other.

2. The method of claim 1 wherein said terminal leads include a brazing material placed at their respective ends for bonding said ends to said multiple bonding pads respectively.

3. The method of claim 1 wherein said step of removing said circular supporting ring is carried out by alternately bending said ring up and down whereby said ring is separated from said bonding pads.

4. A method for constructing an axial lead header, for a planar contact semiconductor device, said header having a plurality of terminal posts, comprising the steps of:
   disposing a planar lead frame having a plurality of inwardly directed bonding pads, one for each post, said pads separated from each other and attached to a circular supporting ring, within a flat supporting member;
   placing a supporting base onto said lead frame, said supporting base having a shell eyelet, a glass preform interiorly disposed within said eyelet with the terminal posts being disposed within and extending through said glass preform;
   bonding said bonding pad simultaneously to their respective terminal posts and to the surface of said glass preform; and
   removing said circular supporting ring for electrically isolating said bonding pads from each other.

5. The method of claim 4 wherein the step of bonding said bonding pads to said terminal posts comprises:
   brazing said terminal posts to respective bonding pads, said terminal posts having a brazing material deposited at the end thereof to be brazed;
   said glass preform is softened for simultaneously sealing said bonding pads to its surface and said terminal posts interiorly of and to said shell eyelet; and
   said glass preform electrically isolating said terminal posts from each other and from shell eyelets thereof.

6. The method of claim 4 wherein the step of removing said circular supporting ring is carried out by alternately bending said ring up and down whereby said ring is separated from said bonding pads.

7. The method of claim 4 comprising the further step of:
   bonding the respective electrodes of a semiconductor chip device to said bonding pads repectively; and
   bonding an outer shell to said header for disposing said semiconductor device therein.

* * * * *